(12) United States Patent
Lee

(10) Patent No.: US 11,353,023 B2
(45) Date of Patent: Jun. 7, 2022

(54) PUMP SYSTEM FOR SEMICONDUCTOR CHAMBER

(71) Applicant: PLAN CO., LTD, Suwon-si (KR)

(72) Inventor: In Cheol Lee, Hwaseong-si (KR)

(73) Assignee: PLAN CO., LTD, Suwon-si (KR)

( * ) Notice: Subject to any disclaimer, the term of this patent is extended or adjusted under 35 U.S.C. 154(b) by 814 days.

(21) Appl. No.: 16/084,467

(22) PCT Filed: Jun. 13, 2017

(86) PCT No.: PCT/KR2017/006140
§ 371 (c)(1),
(2) Date: Sep. 12, 2018

(87) PCT Pub. No.: WO2018/169133
PCT Pub. Date: Sep. 20, 2018

(65) Prior Publication Data
US 2021/0180596 A1    Jun. 17, 2021

(30) Foreign Application Priority Data

Mar. 15, 2017    (KR) .......................... 10-2017-0032333

(51) Int. Cl.
*F04C 18/08*    (2006.01)
*H01L 21/02*    (2006.01)
*H01L 21/67*    (2006.01)

(52) U.S. Cl.
CPC .............. *F04C 18/08* (2013.01); *H01L 21/02* (2013.01); *H01L 21/67098* (2013.01); *H01L 21/67248* (2013.01)

(58) Field of Classification Search
None
See application file for complete search history.

(56) References Cited

U.S. PATENT DOCUMENTS

| 7,722,332 B2 * | 5/2010 | Lim ........................ F04C 18/16 |
|---|---|---|
| | | 417/205 |
| 2004/0012319 A1 * | 1/2004 | Shun'ko ........... H01J 37/32357 |
| | | 313/361.1 |

FOREIGN PATENT DOCUMENTS

| JP | 38-078300 A | 3/1996 |
|---|---|---|
| JP | 08078300 A * | 3/1996 |

(Continued)

OTHER PUBLICATIONS

Machine Translation of KR20150119687 (Obtained From https://translationportal.epo.org/) (Year: 2021).*

(Continued)

*Primary Examiner* — Peter J Bertheaud
*Assistant Examiner* — Geoffrey S Lee
(74) *Attorney, Agent, or Firm* — Hauptman Ham, LLP

(57) ABSTRACT

Disclosed is a pump system for a semiconductor chamber includes a housing having a front chamber and a rear chamber, a roots-type rotor provided to the front chamber of the housing, a screw-type rotor provided to the rear chamber, a shaft member coupled through the roots-type rotor and the screw-type rotor, and a driving motor provided to the outside of the housing in such a way as to be axially connected to the shaft member to provide power for driving the rotors. A fluid pipe is provided to the outside of the housing to connect the front chamber and the rear chamber. The fluid pipe is provided with a heater and/or a cooler to heat or cool the fluid flowing through the fluid pipe.

5 Claims, 4 Drawing Sheets

(56) References Cited

FOREIGN PATENT DOCUMENTS

| KR | 10-0151320 B1 | 11/1998 |
|---|---|---|
| KR | 10-0497982 B1 | 7/2005 |
| KR | 10-2006-0029465 A | 4/2006 |
| KR | 10-0605389 B1 | 8/2006 |
| KR | 10-0624982 B1 | 9/2006 |
| KR | 10-0778871 B1 | 11/2007 |
| KR | 10-1117098 B1 | 3/2012 |
| KR | 10-2012-0073482 A | 7/2012 |
| KR | 10-2013-0024028 A | 3/2013 |
| KR | 10-2015-0057663 A | 5/2015 |
| KR | 20150119687 A * | 10/2015 |
| KR | 10-1574121 B1 | 12/2015 |
| TW | 200609434 A | 3/2006 |

OTHER PUBLICATIONS

Machine Translation of JP 08078300 (Obtained From https://translationportal.epo.org/) (Year: 2021).*
International Search Report dated Dec. 13, 2017, issued in corresponding International Application No. PCT/KR2017/006140.

* cited by examiner

PUMP SYSTEM FOR SEMICONDUCTOR CHAMBER

CROSS-REFERENCE TO RELATED APPLICATIONS

This present application is a national stage filing under 35 U.S.C. § 371 of PCT application number PCT/KR2017/006140 filed on Jun. 13, 2017 which is based upon and claims the benefit of priority to Korean Patent Application No. 10-2017-0032333, filed on Mar. 15, 2017, in the Korean Intellectual Property Office. The disclosures of the above-listed applications are hereby incorporated by reference herein in their entirety.

TECHNICAL FIELD

The present invention relates to a pump system for a semiconductor chamber and, more particularly, to a pump system that is used in the manufacture of semiconductors or flat panel displays (FPDs) so as to create a vacuum state in a semiconductor chamber, to discharge gases generated in the semiconductor chamber, or to maintain the inside of the chamber to have an appropriate pressure.

BACKGROUND ART

As well known in the art, semiconductor devices such as memory devices, logic devices, etc. are manufactured by means of repeatedly performing on a semiconductor substrate such as a silicon wafer a series of processes including diffusion, oxidation, photolithography, chemical vapor deposition, metallization, and the like.

Such semiconductor manufacturing processes are performed in a process chamber, in which during the manufacturing processes, a suitable temperature and pressure for process conditions, as well as a vacuum state for prevention of contamination caused by particles or the like, particularly, should be maintained in the inside of the process chamber.

A vacuum pump system for a semiconductor process chamber generally includes a process chamber that is provided for allowing the formation of a semiconductor member, which is performed by a forming die, to be carried out in a vacuum state, and a vacuum pump that supplies ambient air from the process chamber and sucks the air in the process chamber to make the inside of the process chamber vacuous.

Further, wafer loading and unloading processes performed at initiation and termination stages in the semiconductor manufacturing process are carried out in a load lock chamber, in which a proper pressure is maintained by a pump for the load lock chamber so that a wafer in the load lock chamber flows into the process chamber having a proper pressure during the manufacturing process.

In the meantime, in order to vacuumize the inside of the process chamber or discharge gaseous material or process by-products generated in the process chamber, a vacuum pump, e.g. a dry-type vacuum pump, is generally used.

Typical vacuum pumps may be of roots-type rotors, screw-type rotors, and a combination thereof.

Recent vacuum pumps are provided with one or more roots-type rotors with a lobe or lobes and one or more screw-type rotors in order to maintain a complete vacuum state in the process chamber and to save on the power cost required in the process chamber.

The roots-type rotor is connected to the process chamber to suck and compress process by-products including gaseous material generated in the process chamber, whereas the screw-type rotor serves to discharge the gases and process by-products sucked from the roots-type rotor out of the process chamber.

The roots-type rotor or the screw-type rotor is associated with the vacuum state of the process chamber so as to operate in a closed state.

There are problems in a conventional pump system functioning to, during the semiconductor manufacturing process, vacuumize the inside of the process chamber, to discharge gases or the like generated in the chamber, to maintain the inside of the chamber to have a proper pressure.

The first problem is that, during the discharge of the gases from the roots-type rotor to the screw-type rotor, the compressed gases at the time of the discharge from the roots-type rotor instantaneously expand so that the temperature decreases and the pressure increases, solidifying the gases into powder by-products.

The powder by-products are introduced into the screw-type rotor so as to be caught and fixedly accumulate in a fine gap of e.g. 100~200 µm between the rotor and a housing wall thereof so that a screw may be damaged by the fixedly accumulated powder by-products, reducing lifetime of the pump.

The second problem is that, unlike the vacuum pump involved in the process chamber, the pump involved in the load lock chamber has a function of compressing the atmosphere to maintain a proper pressure of the chamber. In such a pump for the load lock chamber, high temperature compression heat is generated due to the great intake of gases, which results in excessive expansion of the rotor and resultant contact interference of the rotor with the housing wall. That is, the excessive expansion of the rotor causes it to grind and damage the housing wall during rotation, leading to a reduction in the operation performance and the lifetime of the rotor.

In fact, the current semiconductor manufacturing process employs one-type pump system irrespective of characteristics of respective chambers. This is disadvantageous in terms of use efficiency of a pump. Further, even when pump systems are respectively operated according to various suitable specifications for the characteristics of respective chambers, facility costs and operation costs increase, which are disadvantageous economically.

In the meantime, gases used in processes such as asking, etching, deposition, washing, nitrification, or the like for manufacturing semiconductors, display panels, solar panels, etc. include volatile organic compounds, acidic materials, odor-causing substances, pyrophoric gases, global warming-causing substances, etc. These gases are discharged as process by-products such as unreacted gases, waste gases, etc. during the manufacturing process.

Among the process by-products such as unreacted gases, waster gases, etc. produced during the manufacturing process, HF, fluorides, chlorides, or the like causes corrosion of a metallic surface during movement through a vacuum pump and plumbing, and most of gases used in the manufacturing process are pollutant substances. Thus, those gases should be removed before being finally discharged into the atmosphere.

Further, metallic materials, fine particles and the like, which are generated in the manufacturing process, are formed into powder-type materials through phase transformation caused due to cooling, pressure difference, or the like while passing through a flowing path such as plumbing. The powder-type materials cause a reduction in lifetime of a vacuum pump.

Perfluorocarbon, one of green-house gases causing a global warming phenomenon, is used as a process gas for dry etching of an insulator in the semiconductor manufacturing process. Since perfluorocarbon is a pollutant, it should be decomposed and removed until being discharged after the completion of the manufacturing process.

In order to process most of pollutant gases including perfluorocarbon, a burn and wet type scrubber is mainly used in a semiconductor field. However, the burn and wet type scrubber has problems in that since the burn and wet type scrubber uses high temperature heat for the decomposition of perfluorocarbon, it also generates NOx, which is another pollutant substance, and when the temperature is lowered to solve this problem, the decomposition efficiency of perfluorocarbon is degraded.

Recently, a vacuum pump cleaning method for processing process by-products using a plasma reaction at the front or rear side of a vacuum pump is mainly used. The use of the plasma processing method is recently increased since the plasma processing method can avoid energy wasting, and increase fluidity of solid process by-products being introduced into a vacuum pump to reduce accumulation of the process by-products in the vacuum pump, thereby increasing lifetime of the vacuum pump.

However, this technique has also problems in that plasma equipment is very expensive, power consumption for generating plasma is high so that installation and maintenance costs are very high, and the plasma equipment reaches about 200 kg, so that installation is a difficult and time-consuming operation.

The heavy weight of the plasma equipment causes many problems in maintenance and repair.

That is, since the heavy plasma equipment may be manually lifted and installed to a high place, there is a danger of injury to laborers.

Further, since most of plasma equipment is installed around a large-diameter (100~250 mm) pipe connecting a process chamber and a vacuum pump, fluid flowing through the center of the pipe is less subjected to a plasma, resulting in a reduction of the processing efficiency.

DOCUMENTS OF RELATED ART

Patent Documents (Patent Document 1) Korean Patent No. 10-0151320;
(Patent Document 2) Korean Patent No. 10-0624982;
(Patent Document 3) Korean Patent No. 10-0497982;
(Patent Document 4) Korean Patent Application Publication No. 10-2013-0024028;
(Patent Document 5) Korean Patent Application Publication No. 10-2012-0073482;
(Patent Document 6) Korean Patent Application Publication No. 10-2015-0057663

DISCLOSURE

Technical Problem

Accordingly, the present invention has been made keeping in mind the above problems occurring in the related art, and the present invention is to provide a pump system for a semiconductor chamber, in which an outer pipe is connected between a roots-type rotor section and a screw-type rotor section, which are involved in a chamber including a process chamber, a load lock chamber, or the like for conditioning an internal environment of the chamber, and a heating/cooling unit including a heater or a cooler, or a combination thereof is provided to the pipe between the roots-type rotor section and the screw-type rotor section to heat or cool gases flowing from a roots-type rotor towards a screw-type rotor, thereby preventing the accumulation of powder by-products in the rotors and resultant damage of the rotors and contributing to an improvement of operation performance and durability of the rotors.

Another aspect of the present invention is to provide a pump system for a semiconductor chamber, in which an internal temperature of a fluid pipe connecting a roots-type rotor section and a screw-type rotor section is monitored so that heating or cooling control can be selectively performed according to the internal temperature of the fluid pipe, thereby controlling a pump to provide an optimal temperature suitable to characteristics of respective chambers and thus operating the pump system economically.

A further aspect of the present invention is to provide a pump system for a semiconductor chamber, in which a small-scale plasma unit for inducing a plasma reaction is provided particularly to a small-diameter (18~25 mm) fluid pipe connecting a roots-type rotor section and a screw-type rotor section so as to implement a by-product gases-processing system able to efficiently decompose and process gases flowing through the fluid pipe, thereby improving efficiency of decomposing and processing the by-product gases as well as obtaining improved performance and durability of a pump.

Technical Solution

Accordingly, the present invention provides a characterized pump system for a semiconductor chamber.

In an embodiment, the pump system for a semiconductor chamber may include: a housing having a front chamber with a fluid inlet and a rear chamber with a fluid outlet; a roots-type rotor provided to the front chamber of the housing; a screw-type rotor provided to the rear chamber of the housing; a shaft member coupled through the roots-type rotor and the screw-type rotor as a rotary axis; and a driving motor provided to one side of the outside of the housing in such a way as to be axially connected to the shaft member to provide power for driving the roots-type rotor and the screw-type rotor.

A fluid pipe may be provided to the outside of the housing in such a way as to connect the front chamber accommodating the roots-type rotor and the rear chamber accommodating the screw-type rotor, wherein the fluid pipe is provided with a heater, a cooler, or a combination thereof to heat or cool the fluid flowing through the fluid pipe.

The heater may be a cartridge-type heater or a cartridge-type heat-dissipation fin heater disposed in the fluid pipe or on a wall part of the fluid pipe, and wherein the cooler may be a water-cooling pipe-type cooler wound around the fluid pipe.

The fluid pipe may be provided with one or more sensors as a means for monitoring temperature of the fluid to allow selective control of the operation of the heater or the cooler in response to the monitored temperature, wherein the sensors may be respectively provided to a wall surface of the fluid pipe and the inside of the inlet of the rear chamber connected to the fluid pipe.

In another embodiment, a pump system for a semiconductor chamber may include: a housing having a front chamber with a fluid inlet and a rear chamber with a fluid outlet; a roots-type rotor provided to the front chamber of the housing; a screw-type rotor provided to the rear chamber of the housing, a shaft member coupled through the roots-type rotor and the screw-type rotor as a rotary axis; and a driving motor provided to one side of the outside of the housing in such a way as to be axially connected to the shaft member to provide power for driving the roots-type rotor and the screw-type rotor, wherein a fluid pipe may be provided to the outside of the housing in such a way as to connect the front chamber accommodating the roots-type rotor and the rear chamber accommodating the screw-type rotor, wherein the fluid pipe is provided with a Peltier element able to heat or cool the fluid flowing through the fluid pipe.

In a further embodiment, a pump system for a semiconductor chamber may include: a housing having a front chamber with a fluid inlet and a rear chamber with a fluid outlet; a roots-type rotor provided to the front chamber of the housing; a screw-type rotor provided to the rear chamber of the housing, a shaft member coupled through the roots-type rotor and the screw-type rotor as a rotary axis; and a driving motor provided to one side of the outside of the housing in such a way as to be axially connected to the shaft member to provide power for driving the roots-type rotor and the screw-type rotor, wherein a fluid pipe may be provided to the outside of the housing in such a way as to connect the front chamber accommodating the roots-type rotor and the rear chamber accommodating the screw-type rotor, wherein the fluid pipe is wound around with a coil having several windings, the coil being supplied with voltage from a generator to cause a plasma discharge in the fluid pipe to decompose the fluid flowing through the fluid pipe.

The coil wound around the fluid coil may be circumferentially provided with a ferrite core.

The fluid pipe may be circumferentially provided with a cooling block having a coolant path, wherein the coil wound around the fluid pipe or the coil and the ferrite core adjoining thereto are provided in the cooling block.

Preferably, a means for supplying a voltage to the coil wound around the fluid pipe may be provided with the generator, which supplies power to both the chamber side and the coil side, and a vacuum relay to allow a switch and a selective supply of the voltage between the chamber side and the coil side.

Preferably, a means for supplying a reactant gas to the fluid pipe may be further provided with a reactant pipe connected to the fluid pipe.

Preferably, a coil may be wound with several windings around the reactant pipe, the coil being supplied with a voltage from a generator to cause a plasma discharge in the reactant pipe to decompose the reactant gas flowing through the reactant pipe.

Advantageous Effects

According to the present invention, the pump system for a semiconductor chamber has the following effects.

First, the outer pipe connected between the roots-type rotor section and the screw-type rotor section is provided with the heating/cooling unit including a heater or a cooler, or a combination thereof to heat or cool gases flowing from the roots-type rotor towards the screw-type rotor, so that the solidification of gases into powders during heating operation is fundamentally prevented, thereby preventing the accumulation of powder by-products in the rotors and resultant damage of the rotors, contributing to an improvement of operation performance and durability of the rotors, and so that compression heat is reduced during cooling operation to prevent the overheating of the rotors, finally improving the operation performance of the rotors.

Second, an internal temperature of the fluid pipe connecting the roots-type rotor section and the screw-type rotor section is monitored so that heating or cooling control can be selectively performed according to the internal temperature of the fluid pipe, thereby controlling a pump to provide an optimal temperature suitable to characteristics of respective chambers used in the semiconductor manufacturing process as well as covering the operation of all chambers with one kind of pump, thereby leading to saving on facility investment and operation costs.

Third, a small-scale plasma unit for inducing a plasma reaction is provided to a small-diameter fluid pipe connecting the roots-type rotor section and the screw-type rotor section so as to efficiently decompose and process gases flowing through the fluid pipe, thereby improving decomposing and processing efficiency of the by-product gases such as NOx as well as obtaining improved performance and durability of a vacuum pump while reducing installation and maintenance costs.

Fourth, the reactant gas is additionally provided into the fluid pipe, thereby further improving the gas-decomposition efficiency, and removing a burning unit from a burn-wet scrubber through a complete reaction between the reactant gas and perfluorocarbon.

BEST MODE

The present invention will now be described in detail with reference to the accompanying drawings.

Figure 1:
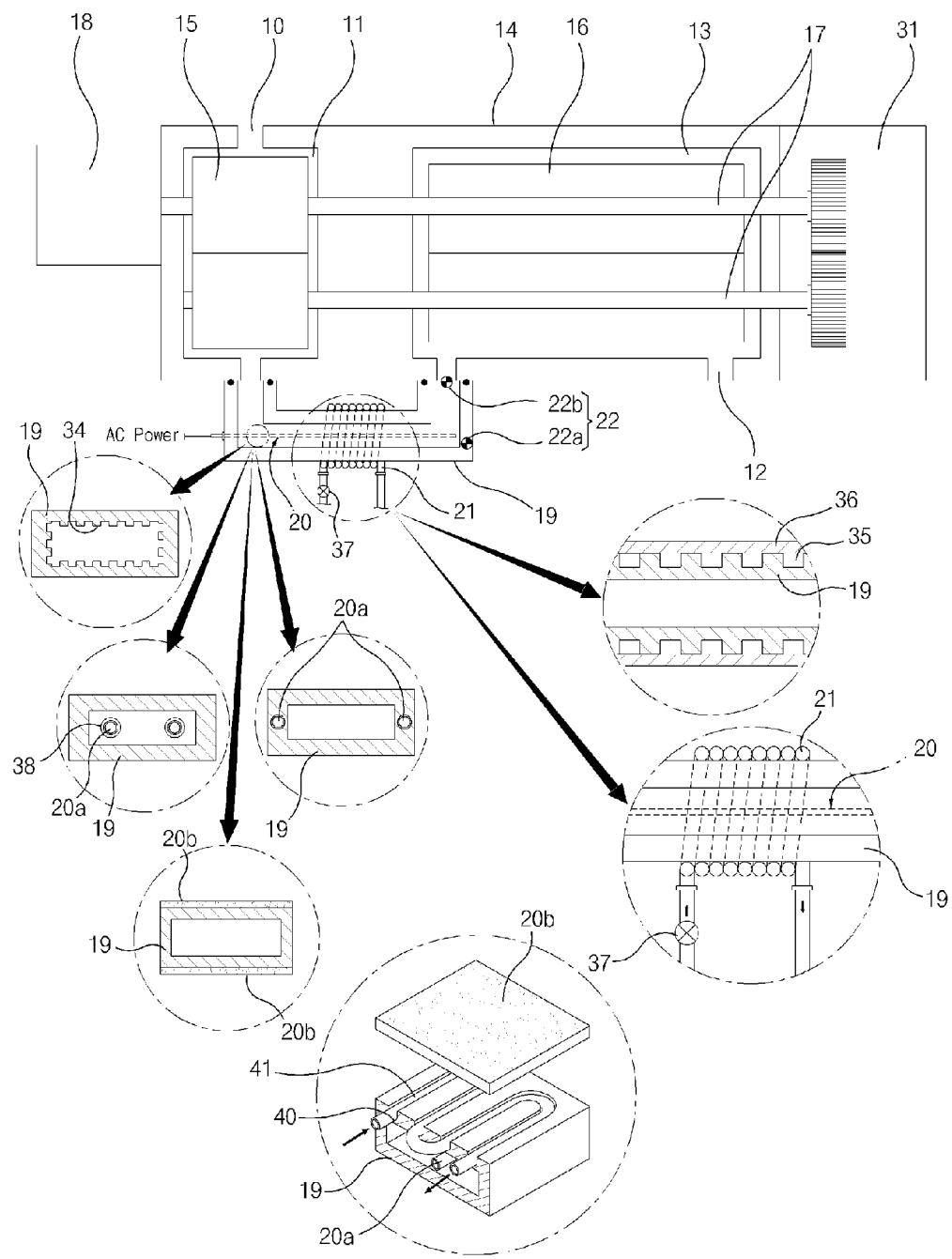
FIG. 1 is a schematic cross-sectional view illustrating a pump system for a semiconductor chamber according to an embodiment of the present invention.

FIG. 1 is a schematic cross-sectional view illustrating a pump system for a semiconductor chamber according to an embodiment of the present invention.

As illustrated in FIG. 1, the pump system for a semiconductor chamber adopts a rotor unit that has a roots-type rotor on the side of a gas inlet and a screw-type rotor on the side of a gas outlet, so that compared to the case having a single screw-type rotor, at the same capacity, the pump system has a reduced size, half power consumption, and improved vacuum level. Also, the pump system can heat or cool fluid (e.g. gases) flowing from the roots-type rotor towards the screw-type rotor to minimize a load applied to the screw-type rotor, such as powder attachment, overheating, etc., thereby improving general performance of a pump.

Here, the gas inlet-side rotor may employ another-type single rotor or a multiple rotor unit in which a plurality of rotors are serially arranged, instead of the roots-type rotor. Further, the gas outlet-side rotor may employ another-type single rotor or a multiple rotor unit in which a plurality of rotors are serially arranged, instead of the screw-type rotor.

In order to aid in understanding the present invention, it is described that in respective embodiments, the roots-type rotor is used as the gas inlet-side rotor, and the screw-type rotor is used as the gas outlet-side rotor.

To this end, the pump system for a semiconductor chamber includes a cylindrical housing 14 as a means for accommodating a roots-type rotor 15 and a screw-type rotor 16.

The housing 14 has a fluid inlet 10 for fluid inflow that is connected to the side of a chamber (not shown) such as a process chamber, and a fluid outlet 12 for fluid outflow that is connected to the atmosphere or the side of a post-treatment unit (not shown).

The inside of the housing 14 is divided into a front chamber 11 in which the roots-type rotor 15 is disposed, and a rear chamber 13 in which the screw-type rotor 16 is disposed.

Further, the pump system includes the roots-type rotor 15 accommodated in the front chamber 11 of the housing 14, and the screw-type rotor 16 accommodated in the rear chamber 13 of the housing 14.

The roots-type rotor 15 serves to suck and compress process by-products including gaseous substances generated from the chamber side, and the screw-type rotor 16 serves to discharge the gases or process by-products sucked and compressed by the roots-type rotor 15.

When applied to a process chamber, the roots-type rotor 15 and the screw-type rotor 16 may be operated in a closed state for maintaining a vacuum state.

Further, the pump system includes a shaft member 17 that is coupled through the roots-type rotor 15 and the screw-type rotor 16 as a rotary axis, and a driving motor 18 that is provided to one side of the outside of the housing 14 in such a way as to be axially connected to the shaft member 17 to provide power for driving the roots-type rotor 15 and the screw-type rotor 16.

The shaft member 17 may consist of a pair of first and second shaft members, wherein the first and second shaft members 17 are coupled to the side of the housing 14 by the medium of a bearing centrally through two pair of roots-type rotor 15 and screw-type rotor 16, respectively, such that the first shaft member 17 is coupled to an axis of the driving motor 18 and the second shaft member 17 is connected indirectly to the first shaft member 17 by the medium of a gear box 31 on one side of the housing 14, thereby allowing the two pairs of roots-type rotors 15 and screw-type rotors 16 to be operated simultaneously during the operation of the driving motor 18.

Here, the configuration in which the pairs of roots-type rotors and screw-type rotors are operated together with the power from the driving motor is the same as that of a conventional combination-type pump in which the roots-type rotor and the screw-type rotor are combined, and therefore a detailed description thereof will be omitted.

That is, like the conventional combination-type pump, the pump system of the present invention is basically operated such that the roots-type rotor sucks gaseous substances and/or process by-products generated from the process chamber or the like through the fluid inlet and the gaseous substances and/or the process by-products are transmitted to the screw-type rotor and discharged through the fluid outlet.

Further, the pump system includes a fluid pipe 19 that is provided between the front chamber 11 involving the roots-type rotor 15 and the rear chamber 13 involving the screw-type rotor 16 to transmit fluid from the roots-type rotor side towards the screw-type rotor therethrough.

The fluid pipe 19 is provided to the outside of the housing 14 in such a way as to connect one side of the front chamber 11, e.g. a lower side opposite to the fluid inlet 10, and one side of the rear chamber 13, e.g. a lower side at an inlet side of the rear chamber.

Alternatively, the fluid pipe 19 may be connected between the front chamber 11 and the rear chamber 13 in a predetermined pattern in an internal space of the housing 14 instead of the outside of the housing 14.

The fluid pipe 19 may have a variety of sectional shapes such as a circle, a rectangle, etc., and may be composed of ceramic, aluminum, stainless steel, iron, or the like.

The fluid pipe 19 may have an inner wall with an irregular surface 34 to increase a contact area with fluid flowing through the fluid pipe 19, which further improves a heat transfer effect.

Particularly, the fluid pipe 19 is provided with a heater 20 to heat the fluid flowing through the fluid pipe 19 and the fluid pipe 19 to maintain the temperature of the fluid pipe itself.

The heater 20 may be a cartridge-type heater 20a or a thermal coil-molded rubber heater 20b that is provided to the inside or outside of a wall part of the fluid pipe 19.

For example, the cartridge-type heater may be inserted into a hole of the wall part of the fluid pipe 19, or the thermal coil-molded rubber heater may be wound around the wall part or formed of the wall part itself. Thus, during the operation of the heater, the temperature of the wall part of the fluid pipe 19 may be kept constant, and the fluid flowing through the fluid pipe may be indirectly heated with heat that is applied to the inside of the fluid pipe through the wall part.

The surface temperature of the fluid pipe 19 can be continuously maintained to be constant using the heat from the heater, so that heat lost through the fluid pipe can be reduced, which is advantageous in controlling the temperature of the fluid flowing through the fluid pipe and additionally preventing the attachment of powders onto the inner wall of the fluid pipe 19 as well.

The heater 20 inserted into the fluid pipe 19 may be coated with DLC, paint, ceramic, $Al_2O_3$, TiAlN, AlN, TiN, or the like, and may be plated with nickel, chromium, or the like, for anti-corrosion treatment.

In another embodiment, the heater 20 may be a cartridge-type heat-dissipation fin heater, i.e. a heater with a plurality of heat-dissipation fins 38 attached around a heating rod.

The heat-dissipation fin heater may serve to heat fluid (gases) flowing through the fluid pipe so as to substantially control the temperature of the fluid.

Particularly, the heat-dissipation fin heater can secure a contact area with the fluid more through the heat-dissipation fins attached to the heating rod, thereby contributing to an improvement of a heat transfer effect.

It is preferred that an internal temperature of the fluid pipe 19 be set to approximately 50° C. to 250° C. to heat fluid using the heater 20.

Thus, in the case of a vacuum pump for creating a vacuum state in a process chamber, while during the discharge of the fluid from the roots-type rotor to the screw-type rotor, the compressed fluid at the time of the discharge from the roots-type rotor instantaneously expands so that the temperature decreases, and according to the embodiment, the fluid is heated during flowing through the fluid pipe 19 so that the temperature increases immediately before the reduction of the temperature, thereby minimizing the generation of power by-products due to the reduction in temperature of the fluid, and finally preventing the attachment of the powder by-products onto the screw-type rotor side.

Further, the fluid pipe 19 is provided with a cooler 21 to cool the fluid flowing through the fluid pipe 19.

The cooler 21 may be a water-cooling pipe-type cooler that is wound around the fluid pipe 19.

For example, the water-cooling pipe-type cooler may be wound around the fluid pipe 19 by several turns through which cooling water is circulated, so that during the operation of the cooler, i.e. during the circulation of the cooling water, the fluid can be cooled with a chill that is applied to the inside of the fluid pipe 19 through the wall part thereof.

The water-cooling pipe-type cooler 21 may preferably be provided with a valve 37 to selectively interrupt a supply of cooling water.

In another embodiment, the cooler 21 may have a configuration in which a groove-type flow path 35, through which cooling water is able to flow, is formed in an outer surface of the wall part of the fluid pipe 19, and a block 36 is provided to cover the flow path 35, so that during circulation of the cooling water through the flow path 35, the temperature of the wall part of the fluid pipe 19 decreases so that the fluid (gases) flowing through the fluid pipe can be cooled.

Here, the cooling water to be circulated through the cooler 21 may preferably use cooling water for cooling a chamber or the like in a pump system.

The internal temperature of the fluid pipe 19, which is obtained with the operation of the cooler 21, may preferably be set to approximately 50° C. to 250° C.

Thus, in the case of a pump for a load lock chamber for maintaining a proper pressure of the inside of the load lock chamber, during discharge of fluid from the roots-type rotor towards the screw-type rotor, the high temperature fluid from the roots-type rotor is cooled to a low temperature while flowing through the fluid pipe 19, thereby preventing the overheating of the screw-type rotor due to an increase in temperature of the fluid.

The heater 20 or the cooler 21 may be provided solely or in combination in the fluid pipe 19 according to characteristics of respective chambers.

In a preferred embodiment, the present invention provides a method for efficiently heating and/or cooling fluid flowing through the fluid pipe 19.

To this end, the cartridge-type heater 20a is disposed in the fluid pipe 19, a pipe groove 40 having a zigzag pattern, for example, is formed on an outer surface of the wall part of the fluid pipe 19, a cooling water pipe 41 through which cooling water is supplied is inserted into the pipe groove 40, and a thermal coil-molded rubber heater 20b is provided on the outer surface of the wall part of the fluid pipe 19.

Here, the cooling water pipe 41 and the thermal coil-molded rubber heater 20b may be provided to one or more surfaces of the fluid pipe 19.

Accordingly, when heating the fluid flowing through the fluid pipe 19, the heater 20a in the fluid pipe and the thermal coil-molded rubber heater 20b on the outer surface of the wall part of the fluid pipe may be operated to heat the fluid, and when cooling the fluid, the heaters may be deactivated and cooling water may be supplied through the cooling water pipe 41 so as to cool the fluid.

In the meantime, the present invention provides a means for monitoring temperature of fluid in a pump, such as a vacuum pump, including the roots-type rotor 15, the screw-type rotor 16, and the like and properly controlling the temperature in response to a pump state.

To this end, the fluid pipe 19 may be provided with one or more sensors 22 as a means for detecting the temperature of the fluid, wherein the sensors 22 may be installed to a wall surface of the fluid pipe 19 and an inlet end of the rear chamber 13 connected to the fluid pipe 19, respectively.

For example, two sensors 22a and 22b may be provided such that the sensor 22a is disposed on the wall surface of the fluid pipe 19 and the other sensor 22b is disposed in the fluid pipe 19 in proximity to the inlet end of the rear chamber 13.

Accordingly, the fluid temperature detected by the sensors 22a and 22b and the temperature of the fluid pipe 19 are input to a controller (not shown), which monitors the input temperature and selectively operates the heater 20 and the cooler in response to the input temperature, thereby properly controlling the overall temperature of the inside of a pump, including the temperature of fluid flowing through the pump, according to characteristics of respective chambers such as a process chamber, a load lock chamber, etc., an operation condition of a pump, or the like.

Figure 2:
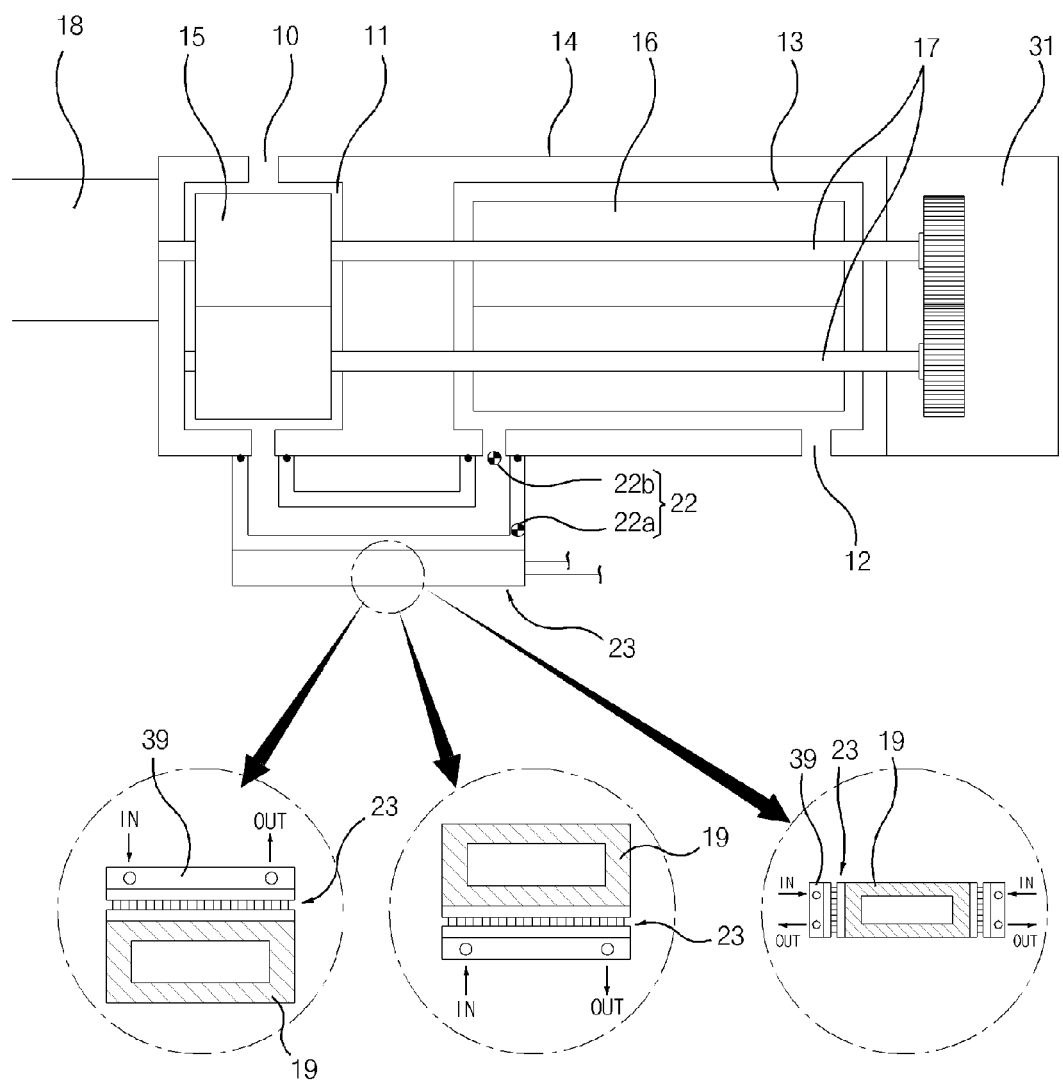
FIG. 2 is a schematic cross-sectional view illustrating a pump system for a semiconductor chamber according to another embodiment of the present invention.

FIG. 2 is a schematic cross-sectional view illustrating a pump system for a semiconductor chamber according to another embodiment of the present invention.

As illustrated in FIG. 2, like the former embodiment, the pump system includes the housing 14, the roots-type rotor 15, the screw-type rotor 16, the shaft member 17, the driving motor 18, and the fluid pipe 19, and a connection relationship among them is the same as that of the former embodiment, so a detailed description thereof will be omitted.

Particularly, a Peltier element 23 is provided as a means for heating or cooling fluid flowing through the fluid pipe 19.

Specifically, the fluid pipe 19 is externally provided to the housing 14 so as to connect the front chamber 11 accommodating the roots-type rotor 15, and the rear chamber 13 accommodating the screw-type rotor 16, and the Peltier element 23 is installed to the fluid pipe 19 to carry out a heating or cooling operation.

The Peltier element 23 may be supported by one or more places among, for example, bottom, top, and sides of the fluid pipe 19 by means of fastening or coupling structure.

The Peltier element 23 may be provided with a cooling block 39 having a cooling water path, through which cooling water for cooling a chamber or the like in a semiconductor apparatus may be circulated.

The Peltier element 23 is a semiconductor element that is able to freely perform a cooling, heating, or temperature-controlling operation with direct current. The Peltier element 23 is operated during a supply of direct current as follows.

1) A difference in temperature is caused between opposite surfaces of the element.

2) The element serves as a heat pump that delivers heat from a lower temperature side to a higher temperature side of a thermoelectric element by absorbing the heat at the lower temperature side and dissipating the heat at the higher temperature side.

3) The element varies heat-pumping direction and amount through a change in the polarity of current to change a pumped-heat amount, thereby facilitating a cooling, heating, or temperature-controlling operation.

Accordingly, the temperature of fluid flowing through the fluid pipe 19 can be heated or cooled with a proper change in the polarity of the Peltier element 23, thereby consequently minimizing the generation of powder by-products and preventing the overheating of the screw-type rotor.

Figure 3:
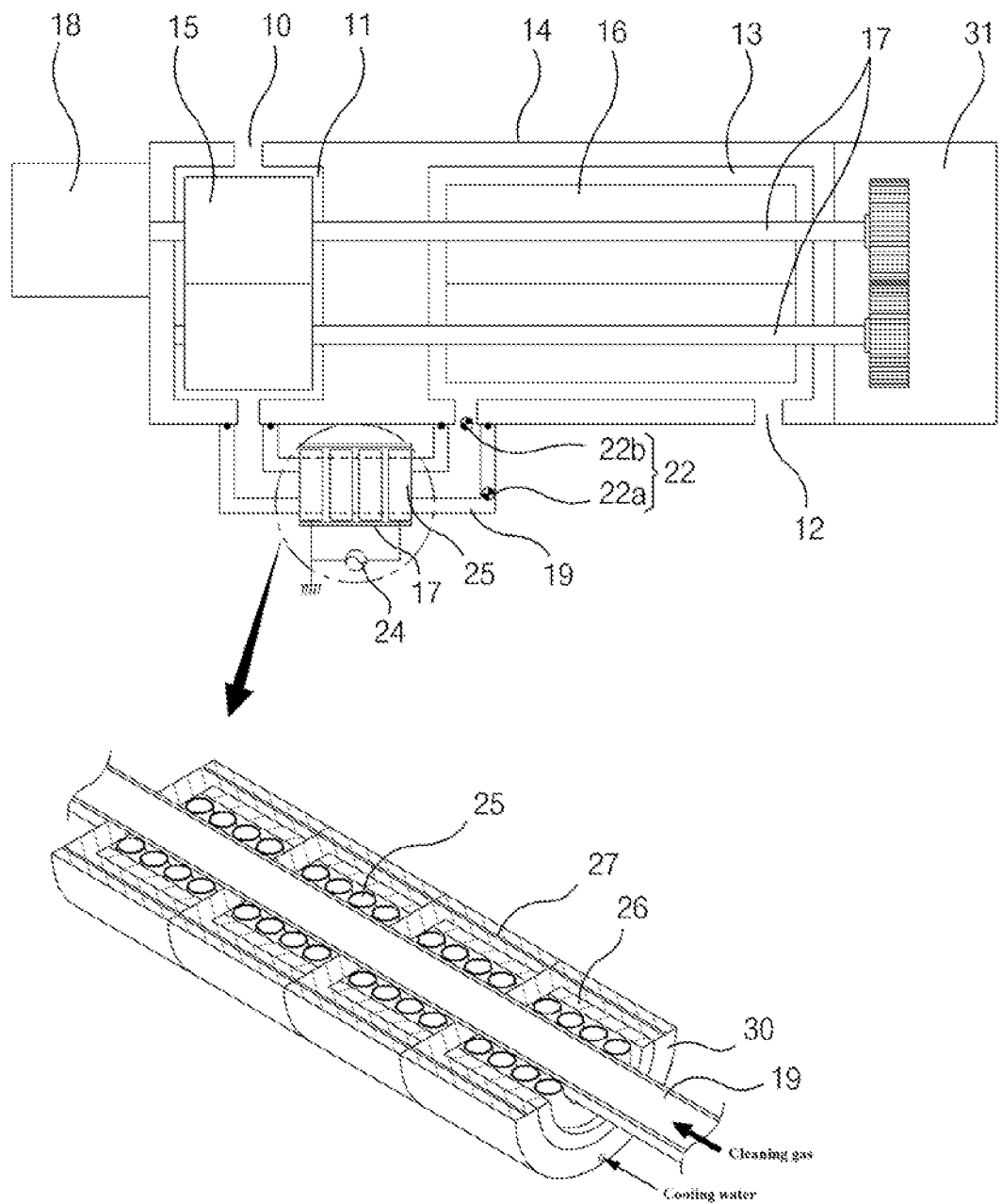
FIG. 3 is a schematic cross-sectional view illustrating a pump system for a semiconductor chamber according to still another embodiment of the present invention.

FIG. 3 is a schematic cross-sectional view illustrating a pump system for a semiconductor chamber according to still another embodiment of the present invention, with a detailed perspective view involved.

As illustrated in FIG. 3, like the former embodiments, the pump system includes the housing 14, the roots-type rotor 15, the screw-type rotor 16, the shaft member 17, the driving motor 18, and the fluid pipe 19, and a connection relationship among them is the same as those of the former embodiments, so a detailed description thereof will be omitted.

Particularly, a means for processing an exhaust fluid is provided to effectively process the fluid flowing through the fluid pipe 19, for example, process by-products such as unreacted gases, waste gases, etc. generated in a semiconductor manufacturing process.

The exhaust fluid processing means is configured such that a small-scale plasma unit such as a plasma coil is wound around a small-diameter fluid pipe 19 connecting the roots-type rotor side and the screw-type rotor side so as to efficiently decompose and process cleaning gases or exhaust fluids through a plasma reaction, thereby obtaining a small-size plasma unit and improving decomposing and processing efficiency of the exhaust fluids by preventing the accumulation of powders in a pump, for example.

To this end, a process chamber for carrying out a manufacturing process in a semiconductor manufacturing apparatus, and a vacuum pump for maintaining a vacuum state of the inside of the process chamber are provided. During the operation of the vacuum pump, exhaust fluids in the process chamber such as a variety of process by-products including unreacted gases, waste gases, etc. are transmitted towards the roots-type rotor 15 of the vacuum pump.

Further, a generator 24 for supplying power to the process chamber, and a gas box (not shown) for supplying process gases or cleaning gases are provided.

Since an associated operation method, a procedure of a process, supply and discharge of gases between the process chamber, the vacuum chamber, the gas box, and the like are the same as those of a conventional technology, a detailed description thereof will be omitted.

Here, the generator 24 may serve to both supply power to the process chamber and apply a voltage to the coil 25 around the fluid pipe 19.

That is, the generator 24 may commonly function to supply power to the process chamber and to apply a voltage to the coil 25.

Along with the common use of the generator 24, a vacuum relay (not shown) is provided to selectively switch the application of the voltage between the process chamber and the coil, so that the voltage can be selectively supplied to the process chamber and the coil.

Here, the vacuum relay may be operated in response to a signal from a process-proceeding main unit.

With the supply of power to the process chamber and the coil 25 using a single generator 24 instead of respective units to supply power to the process chamber and the coil, it is advantageous in terms of structural, economical, and operational aspects.

Of course, the generator 24 may consist of two generator units to supply power to the process chamber and the coil, respectively, instead of a single common generator.

Particularly, the fluid pipe 19 connecting the front chamber 11 accommodating the roots-type rotor 15 and the rear chamber 13 accommodating the screw-type rotor 16 may be used as pipe in which a plasma reaction occurs for the decomposition of cleaning gases.

For example, cleaning gases introduced towards the pump side during the operation of the pump may be decomposed and processed by a plasma reaction while flowing through the fluid pipe 19, and the decomposed gases react with powders attached to the pump side, for example, $SiO_2$ powders, thereby cleaning the pump.

Here, the configuration is advantageous in reducing power consumption since the plasma reaction occurs in a vacuum state of a vacuum pump rather than in an atmospheric condition.

Particularly, the spiral coil 25 is wound around the fluid pipe 19 by several turns to generate plasma with a voltage applied from the generator 24. When applied with a voltage, the coil 25 serves to induce a plasma discharge in the fluid pipe 19 so as to decompose the cleaning gases flowing through the fluid pipe 19 using the plasma discharge.

For example, during the cleaning process of a vacuum pump, in which cleaning gases such as Ar gas, $NF_3$ gas, etc. are supplied from the gas box, while the Ar gas and the $NF_3$ gas flow through the fluid pipe 19, the gases are decomposed into Ar gas, $N_2$ gas, and $F_2$ gas (here, the Ar gas serves to improve plasma efficiency) through a plasma discharge, and the decomposed gases flow towards the screw-type rotor 16 and react with remaining $SiO_2$ powders in the screw-type rotor 16 to produce $SiF_4$ gas, NxO gas, and $N_2$ gas. Then, the produced gases are discharged so as to remove $SiO_2$ powders accumulated in the screw-type rotor 16.

Here, the cleaning gas may include CxFy type gases, such as $CF_4$, $C_2F_6$, $C_3F_8$, etc, $F_2$ gas, and the like, in addition to the Ar gas and $NF_3$ gas.

When a plasma pipe is applied to the fluid pipe 19 in the vacuum pump, the plasma reaction occurs enough to reach the core part as well as the outer part of the fluid pipe, consequently further improving decomposition efficiency of exhaust fluids.

Since a diameter of a pipe connecting a booster pump and a dry pump generally amounts to approximately 50 mm to 60 mm, in order to provide a plasma unit to such a pipe, it is difficult to make the plasma unit smaller and to secure an installation space for the plasma unit in the pump. Thus, for the application of the plasma unit, there is a problem in that the entire size of the pump should be designed to be larger.

Further, when a coil for generating a plasma reaction is provided around the 5060 mm diameter pipe and the plasma reaction is induced, the plasma is not actively generated at the core part of the pipe, thereby resulting in a reduction in plasma generation efficiency.

To solve these problems, according to the present invention, the coil is provided to a relatively small diameter pipe so that a plasma reaction occurs around the small size pipe, thereby obtaining a small-size plasma unit while improving plasma generation efficiency.

Further, a ferrite core 26 having a semi-circular sectional shape may be disposed around the coil 25 wound around the fluid pipe 19.

Such an arrangement of the ferrite core 26 around the coil 25 serves to prevent a coil-side magnetic field from escaping to the outside, thereby further improving the plasma generation efficiency.

At the same time, heat is generated during the plasma reaction caused by the coil 25 wound around the fluid pipe 19. The fluid flowing through the fluid pipe 19 can be heated using the generated heat, which is advantageous in effectively heating the fluid to restrict the generation of powders without a separate heating unit.

In the meantime, in order to prevent the overheating of the fluid pipe 19 during the generation of the plasma, a cooling block 30 having a cooling water path 27 is provided around the circumference of the fluid pipe 19, and a coil 25 is disposed at the inside of the cooling block 30, for example, at the inside of a groove part formed on an inner circumference of the cooling block.

For example, the cooling block 30 may cover the coil 25 wound around the fluid pipe 19.

Here, at the inside of the cooling block 30, the coil 25, or the coil 25 and the ferrite core 26 covering the coil 25 may be disposed.

The cooling block 30 may have a multi-block structure in which unit blocks are arranged such that the respective cooling water paths 27 of the unit blocks communicate with each other.

Figure 4:
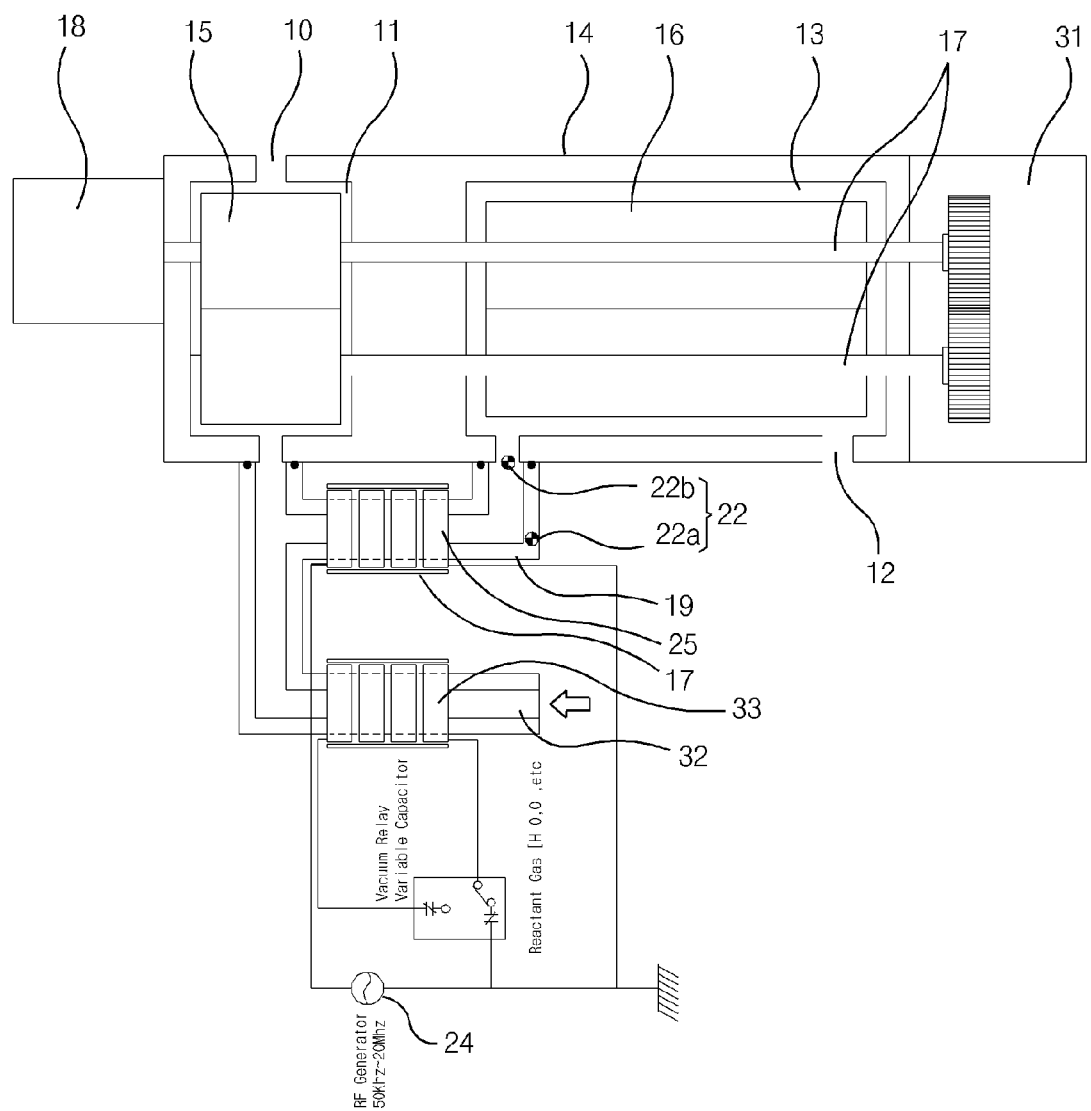
FIG. 4 is a schematic cross-sectional view illustrating a pump system for a semiconductor chamber according to yet another embodiment of the present invention.

FIG. 4 is a schematic cross-sectional view illustrating a pump system for a semiconductor chamber according to yet another embodiment of the present invention.

FIG. 4 shows the case in which exhaust fluids discharged from a process chamber are completely decomposed. While the embodiment will describe the decomposition of the exhaust fluids discharged from the process chamber, the embodiment may also be applied to the decomposition and processing of cleaning gases.

To this end, a fluid pipe 19 around which a coil 25 is wound is provided so that during the application of a voltage to the coil 25, a plasma discharge is induced in the fluid pipe 19 to cause the exhaust fluids flowing through the fluid pipe 19 to be decomposed through a plasma reaction.

As a means for supplying a reactant gas to the fluid pipe 19, a reactant pipe 32 is provided so that it is connected to the fluid pipe 19.

Accordingly, since the reactant gas supplied from an external gas source (not shown) can be supplied to the fluid pipe 19 through the reactant pipe 32, the decomposition of the exhaust fluid can be accelerated.

The reactant gas for the decomposition of the exhaust gas may include argon, methane, ammonia, $H_2O$, $O_2$, etc.

Here, the argon gas aids in creating a plasma state to generate electrons, which may collide with and decompose exhaust gases, e.g. perfluorocarbon.

Further, the collision of electrons with water vapor induces a reaction $H_2O \rightarrow OH+H$, wherein OH, which is a stronger oxidizer than oxygen (O), reacts with perfluorocarbon to produce fluorine (F), and the fluorine decomposed from perfluorocarbon reacts with hydrogen to produce hydrogen fluoride, which is discharged in a vapor state.

Further, a coil 33 may be wound around the reactant pipe 32 by several turns, so that, when applied with a voltage from a generator 24, the coil generates a plasma state.

Accordingly, when applied with a voltage, the coil 33 induces a plasma discharge in the reactant pipe 32 to assist in decomposing the reactant gases flowing through the reactant pipe 32. As a result, the reactant gases are supplied to the fluid pipe 19 in a decomposed state that is previously obtained through a plasma reaction, thereby further improving the decomposition efficiency of exhaust gases.

For example, in the case in which $CF_4$ gas as a process by-product gas is discharged from a process chamber, the $CF_4$ gas is decomposed into C and $F_2$ through a plasma reaction while flowing through the fluid pipe 19, and at the same time, vapor-phase $H_2O$ is decomposed into OH and O through a plasma reaction while flowing through the reactant pipe 40.

Subsequently, in the fluid pipe 19, C, $F_2$, OH, and O react with each other to produce HF gas and $CO_2$ gas, which are finally discharged out of an outlet of a pump. The discharged HF gas and $CO_2$ gas flow through a gas scrubber (not shown) having a burner and a water shower on the outlet side of a vacuum pump, so that the gaseous HF is dissolved in water during passing through the water shower and discharged as waste water.

The acidic waste water is separately neutralized into and discharged as neutral water that is harmless to humans. As a result, fluorine (F), which is an environmentally regulated substance, is completely removed.

With the implementation of an apparatus allowing complete reaction between the reactant gases and perfluorocarbon, a burning device is not required. Thus, a conventional burn and wet type scrubber that is a post-treatment device disposed at a rear side (at a rear outlet line side) of a vacuum pump can be replaced with a wet type scrubber having no burner, which is advantageous in terms of scale or operation aspects.

Particularly, since the plasma discharge is induced in the reactant pipe 40 or the fluid pipe 19 not in an atmospheric condition, but is a vacuum state in a vacuum chamber, there is an advantage of low power consumption.

As set forth in the foregoing, the present invention provides a new pump system in which the outer pipe connecting the roots-type rotor section and the screw-type rotor section in a pump is provided with the heating/cooling unit having a heater, a cooler, or a combination thereof, so that accumulation of powder by-products in the rotor and resultant damage of the rotor can be prevented, and the temperature of fluid flowing through the pipe can be monitored so as to control the pump to have a proper temperature according to characteristics of respective chambers.

Further, the present invention provides a new reaction by-product gas-processing unit, in which a plasma unit is provided around the outer pipe of a vacuum pump, to efficiently decompose and process fluids flowing through the outer pipe, thereby further improving the decomposition and processing efficiency of process by-product gases.

DESCRIPTION OF THE REFERENCE NUMERALS

10: Inlet
11: Front chamber
12: Outlet
13: Rear chamber
14: Housing
15: Roots-type rotor
16: Screw-type rotor
17: Shaft member
18: Driving motor
19: Fluid pipe
20: Heater
21: Cooler
22, 22a, 22b: Sensor
23: Peltier element
24: Generator
25: Coil
26: Ferrite core
27: Cooling water path
30: Cooling block
31: Gear box
32: Reactant pipe
33: Coil for reactant pipe
34: Irregular surface
35: Path
36: Block
37: Valve
38: Heat-dissipation fin
39: Cooling block
40: Pipe groove
41: Cooling water pipe

The invention claimed is:

1. A pump system for a semiconductor chamber, the pump system comprising:
   a housing having a front chamber with a fluid inlet and a rear chamber with a fluid outlet;
   a fluid inlet-side rotor provided to the front chamber of the housing;
   a fluid outlet-side rotor provided to the rear chamber of the housing;
   a shaft member coupled through the fluid inlet-side rotor and the fluid outlet-side rotor as a rotary axis; and
   a driving motor provided to one side of an outside of the housing in such a way as to be axially connected to the shaft member to provide power for driving the fluid inlet-side rotor and the fluid outlet-side rotor,
   wherein a fluid pipe is connected between the front chamber accommodating the fluid inlet-side rotor and the rear chamber accommodating the fluid outlet-side rotor,
   wherein the fluid pipe is provided with a heater, a cooler, or a combination of the heater and the cooler to heat or cool the fluid flowing through the fluid pipe, and
   wherein a cartridge-type heater is disposed in the fluid pipe, a cooling water pipe is provided to an inside of a pipe groove on an outer wall part of the fluid pipe, and a thermal coil-molded rubber heater is provided on the outer wall part of the fluid pipe, in which the cooling water pipe is provided, so as to heat or cool the fluid flowing through the fluid pipe.

2. The pump system of claim 1, wherein the heater disposed in the fluid pipe is coated with DLC, paint, ceramic, $Al_2O_3$, TiAlN, AlN, or TiN, or the heater is plated with nickel or chromium for anti-corrosion treatment.

3. The pump system of claim 1, wherein the cooler comprises a water-cooling pipe-type cooler wound around the fluid pipe.

4. The pump system of claim 1, wherein the fluid pipe is provided with one or more sensors as a means for monitoring temperature of the fluid to allow selective control of an operation of the heater or the cooler in response to the monitored temperature.

5. The pump system of claim 4, wherein the sensors are respectively provided to a wall surface of the fluid pipe and an inside of an inlet of the rear chamber connected to the fluid pipe.

* * * * *